United States Patent [19]

Faris

[11] 4,210,921
[45] Jul. 1, 1980

[54] POLARITY SWITCH INCORPORATING JOSEPHSON DEVICES

[75] Inventor: Sadeg M. Faris, Yorktown Heights, N.Y.

[73] Assignee: International Business Machines Corporation, Armonk, N.Y.

[21] Appl. No.: 920,911

[22] Filed: Jun. 30, 1978

[51] Int. Cl.² ............................................. H01L 39/22
[52] U.S. Cl. ........................................ 357/5; 307/306; 365/162
[58] Field of Search ............................ 307/306; 357/5; 365/162

[56] References Cited

U.S. PATENT DOCUMENTS

| | | | |
|---|---|---|---|
| 3,758,795 | 9/1973 | Anacher | 307/306 |
| 3,913,120 | 10/1975 | Lohiri | 357/5 |
| 3,978,351 | 8/1976 | Zappe | 307/306 |
| 4,151,605 | 4/1979 | Faria | 365/162 |

OTHER PUBLICATIONS

Kotyczka et al., I.B.M. Tech. Discl. Bull., vol. 18, No. 12, May 1976, p. 4166.
Zappe, I.B.M. Tech. Discl. Bull., vol. 19, No. 11, Apr. 1977, p. 4467.

Primary Examiner—Martin H. Edlow
Attorney, Agent, or Firm—Thomas J. Kilgannon, Jr.

[57] ABSTRACT

A polarity switch which utilizes Josephson interferometers and low drive currents is disclosed. Single ended and double ended polarity switches which are electrically the same include a pair of circuits interconnected so that the application of a pair of signals to the circuits applies a current of one polarity or the other to a utilization circuit connected to the pair of circuits. Each of the pair of circuits includes a Josephson device which carries gate current; a current path shunting the device having a transformer secondary disposed serially in the path and another Josephson device serially disposed in the same current path. The transformer secondary is coupled to a primary through which a current is passed at the outset of the memory cycle. A current is induced in the current path of one of the pair of circuits which is in opposition to the gate current flowing in the Josephson device carrying that current. The induced current and the gate current effectively cancel one another resulting in a total current of zero flowing in the Josephson device. Then, a decoder output control line which is disposed in electromagnetically coupled relationship with both of the Josephson devices of the other of the pair of circuit switches them to the voltage state causing current to be diverted into an interconnection line which is connected to the utilization circuit.

18 Claims, 2 Drawing Figures

POLARITY SWITCH INCORPORATING JOSEPHSON DEVICES

DESCRIPTION

1. Technical Field

This invention relates to polarity switching circuits and more particularly to such circuits which utilize Josephson junction devices and superconducting interconnections in a cryogenic environment. The Josephson devices utilized may be multi-junction Josephson interferometers which are compatible with both logic circuits and memory cells which use similar devices as their switchable elements.

2. Background Art

The use of bridge circuits reversing the direction of current in an output circuit is well known. Examples of such circuits are shown in the IBM Technical Disclosure Bulletin, Volume 18, No. 12, May 1976, page 4166 in an article entitled "Polarity Converter" in the name of W. Kotyczka, et al. In the operation of the polarity converter of the article, when devices in opposite branches of the bridge are switched to provide a path to an output load, the current provided is twice the gate current normally applied to each device in the bridge when none are switched. It thus follows that the switchable devices and any utilization circuit must be designed to handle twice the current normally seen by one of the bridge devices or other steps must be taken to reduce the output current to a desired level. In addition, margin requirements are rather stringent inasmuch as the resulting gate current is quite close to the switching threshold of the devices involved under ordinary circumstances. Under such conditions, current variations which result from the spread in fabrication tolerances can cause spurious switching of devices in bridge circuits just described and, in turn, cause unwanted storage of information or switching of logic circuits which are connected to the output of such bridge circuits.

Another circuit which has similar constraints is shown in IBM Technical Disclosure Bulletin, Volume 19, No. 11, April 1977, page 4467 in an article entitled "Current Inverter for Josephson Memory Arrays" but H. H. Zappe. In the circuit of the article, the current steering elements which, in the unswitched state, carry only one unit of a gate current must, when one of the current steering devices is switched, carry two units of gate current resulting in the above mentioned margin problems due to the spread in fabrication tolerances. In addition, output circuits which utilize high current levels are required. In the circuits of the present invention, the maximum current carried by any of the switchable devices is equal to the gate current through one of the devices of the circuit in the unswitched state. This is achieved by the cancellation of gate current flowing in one of a pair of devices in a first circuit and by the switching of a pair of devices in a second circuit such that current diverted as a result of the switching of the pair of devices now flows in the device in which current was originally cancelled. The resulting single unit of current therein is delivered to a utilization circuit which can operate at the current levels at which the devices of the polarity switching circuits operate. In this manner, tight margin requirements which stem from unavoidable fabrication tolerances are eliminated.

Accordingly, it is a principal object of the present invention to provide a current polarity switch in which the output currents are relatively low level and compatible with the current levels required in the utilization circuits such as memory cells.

It is another object of the present invention to provide a current polarity switch which is faster than prior art circuits and possesses relaxed margin requirements.

It is another object of the present invention to provide a circuit in which interferometers with their low level current requirements can be utilized.

BRIEF SUMMARY OF THE INVENTION

The current polarity circuit of the present invention, in a preferred embodiment, utilizes multi-junction Josephson interferometers which, relative to known single junction Josephson devices, require much lower level gate currents. This lower level of gate current is compatible with current levels required for utilization circuits connected to the polarity switching circuit and permits similar fabrication techniques to be utilized in both the utilization circuits and the polarity switching circuits. The output current level provided to the utilization circuits is no greater than the current level experienced by any one device present in the circuits which achieve the current polarity reversal. The desired output current level, of one polarity or the other, is achieved by cancelling the gate current in one of a pair of Josephson interferometers such that the current therethrough is effectively zero. This is achieved by a current path which includes the secondary of a transformer disposed in parallel with each of the pair of devices. Each of the secondaries is connected to a separately actuated primary. When one of the primaries is actuated, current flowing in the associated secondary is arranged to flow in the opposite direction to the current flow in the device which is shunted by that secondary. The Josephson device associated with the unactuated secondary is now switched to prevent the flow of current through it. At the same time, a Josephson device in series with the unactuated secondary is switched to eliminate the unactuated secondary as a current path. In this way, the current removed from the device associated with the unactuated secondary is diverted through the other Josephson device which has an effective zero current in it. This diverted current is equal to the current initially flowing in the Josephson device which had its initial current cancelled. The diverted current now flows through an interconnection line which is coupled to a utilization circuit which may be one or a plurality of memory cells or logic circuits. By actuating the secondary which was originally unactuated and switching the devices associated with the originally actuated secondary after resetting the output circuit, a current in the opposite direction can be delivered to the same utilization circuit. Thus, it is seen that only one unit of current is delivered to the utilization circuits where formally two units of current using prior art circuits was delivered to the utilization circuits. In this way, margin problems are avoided and fabrication tolerances are less stringent. The double and single ended circuits disclosed, while electrically identical, can be utilized where topological requirements make one arrangement more desirable than the other.

These and other objects, features and advantages will be more apparent from the following more particular description of the preferred embodiments.

DETAILED DESCRIPTION OF THE PREFERRED EMBODIMENTS

Figure 1:
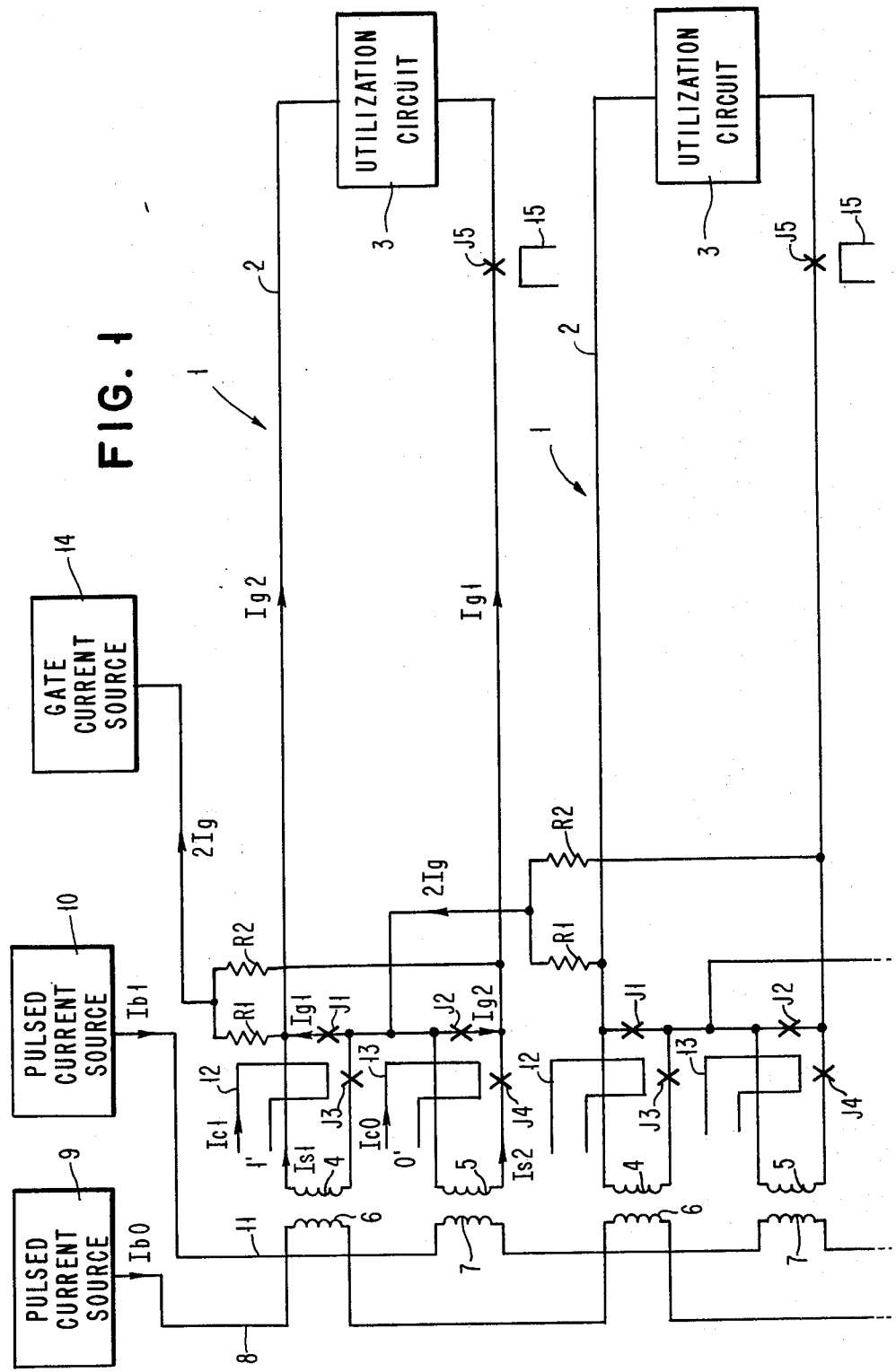
FIG. 1 is a schematic drawing of a plurality of polarity switching circuits which includes gate current cancellation circuits for each of a pair of Josephson interferometers; one of which is switched to divert a unit of current through the device experiencing gate current cancellation and, from thence to a utilization circuit. By interchanging the devices in which current cancellation and switching occurs, one unit of output current of opposite polarity can be delivered to a utilization circuit.

Referring now to FIG. 1, there is shown therein a schematic diagram of a plurality of polarity reversing circuits in which the circuits controlling the polarity of the generated current are interconnected by an interconnection line. A utilization circuit which may be one or more Josephson-type memory cells or logic circuits is disposed serially in the interconnection line.

Referring to FIG. 1 in more detail and to the uppermost current polarity switching circuit 1 in particular, circuit 1 includes a pair of devices J1, J2 arranged in series with each other. In a preferred embodiment, devices J1, J2 may be multijunction interferometers well known to those skilled in the superconductive Josephson art. An interconnection line 2 is connected across devices J1, J2 along with a serially disposed utilization circuit 3. Interconnection line 2 may be any metal which is superconducting at a temperature of 4.2° Kelvin. Lead and lead alloys are typical metals which are superconducting at 4.2° Kelvin. Utilization circuit 3 may be any superconducting circuit which is responsive to or requires for its operation the reversal of current therethrough. Thus, utilization circuit 3 may be one or more superconducting memory cells of a type well-known to those skilled in the Josephson superconducting art which require two cell current polarities to set up counter-rotating circulating currents which are representative of two binary conditions. In FIG. 1, devices J1, J2 are shunted by transformer secondaries 4, 5, respectively. Transformer secondary 4 is shown disposed in electromagnetically coupled relationship with transformer primary 6 while transformer secondary 5 is shown disposed in electromagnetically coupled relationship with transformer primary 7. Transformer primary 6 is connected via interconnection line 8 to a pulsed current source 9 which provides current Ib0 to transformer primary 6 and all other serially disposed transformer primaries 6. Similarily, pulsed current source 10 is connected via interconnection line 11 to transformer primary 7. Pulsed current source 10 provides current Ib1 to transformer primary 7 and all other serially disposed transformer primaries 7. Transformer secondaries 4, 5 contain serially disposed Josephson junction devices J3, J4, respectively. Like devices J1, J2, devices J3, J4 may be multi-junction interferometers well-known to those skilled in the Josephson superconducting art. A control line 12 is shown in FIG. 1 disposed in electromagnetically coupled relationship with devices J1, J3. Similarily, control line 13 is shown in FIG. 1 disposed in electromagnetically coupled relationship with devices J2, J4. Control line 12 carries a current Ic1 while control line 13 carries current Ic0. These currents are derived from a decoder (not shown) or other appropriate source of pulsed current. If connected to a decoder, current Ic1 may be representative of a binary 1, while current Ic0 may be representative of binary 0. In FIG. 1, gate current source 14 provides gate current 2Ig to parallel resistors R1, R2. Resistors R1, R2 have the same values of resistance and thus provide currents Ig1, Ig2 to devices J1, J2, respectively. Gate current source 14 may be a source of direct current or a pulsed source of direct current.

To obtain currents which flow in opposite directions in interconnection line 2 and utilization circuit 3, current polarity switching circuit 1 is operated in the following way. Assuming that gate current source 14 is energized and that currents Ig1, Ig2 are flowing as shown in FIG. 1 in Josephson devices J1, J2, respectively, current flow in interconnection line 2 in one direction can be achieved by simultaneously energizing pulsed current source 9 and providing current Ic0 in control line 13. Pulsed current source 9 provides current Ib0 via interconnection 8 to primary winding 6. By winding secondary winding 4 in an appropriate manner, a current is induced in secondary winding 4 which is equal in magnitude and opposite in polarity to current Ig1 which is flowing in device J1. The current through device J1 is, therefore, effectively zero. The induced current shown as Is1 in FIG. 1, flows through devices J1, J3 which remain in the zero-voltage state inasmuch as current Is1 is below the threshold current of both of these devices. In the meantime, a decoder (not shown) or other appropriate current source applies current Ic0 to control line 13. With current Ig2 flowing in device J2, the application of current Ic0 in control line 13 causes device J2 to switch to the voltage state diverting current Ig2 into secondary winding 5 and device J4 which now switches to the voltage state due to current Ic0 in control line 13. It should be noted that control line 13 is disposed in electromagnetically coupled relationship with both devices J2 and J4. With no path available through switched devices J2, J4, current Ig2 now diverts through device J1 which is still in the zero-voltage state. Current Ig2 is now the only current in device J1, current Ig1 initially flowing therein having been effectively cancelled by induced current Is1. Current Ig2 which represents half the current initially applied to polarity switching circuit 1 is of the same magnitude as initially applied current Ig1 and represents only one unit of current instead of the two units of current normally passing through a device such as J1 in prior art circuits. Thus, it is seen that by the cancellation technique of the present invention, the induced current Is1 effectively reduces the gate current Ig1 in device J1 to zero in an action preparatory to re-introducing current Ig2 which is of the same magnitude as the initially applied current Ig1. This technique provides a circuit wherein the circuit margins are substantially relaxed and wherein high-speed operation is practicable. Current Ig2 which is now flowing in device J1 now passes into interconnection line 2 and utilization circuit 3 returning via resistor R2 to gate current source 14. To the extent that interconnection line 2 and utilization circuit 3 may consist entirely of superconductors, circulating current may be set up in interconnection line 2 after pulsed current source 9 and the decoder or other source which supplies current Ic0 go down. Josephson device J5 shown disposed in series in interconnection line 2 in FIG. 1 interrupts any such circulating currents by applying a current to control line 15. In this manner, current polarity switching circuit 1 is effectively reset. Devices J1, J3 require no reseting since they have remained in their zero-voltage state during this portion of the operation of current polarity switching circuit 1. Because devices J2, J4 have been switched to their voltage state and the current initially in them has been diverted elsewhere, they experience zero current and accordingly reset to the zero-voltage state.

Once this happens, current 2Ig redistributes in devices J1, J2 so that currents Ig1, Ig2, respectively, flow therein. While interconnection line 2 now appears to be in parallel with devices J1, J2, it should be appreciated that when device J2 switches, interconnection line 2 now appears as a series inductance of rather high value through which current Ig2 flows via utilization circuit 3 and resistor R2 back to gate current source 14. The inductances of device J1 and secondary winding 4 in parallel form an effective series inductance which is in series with the inductance of interconnection line 2.

Once current polarity switching circuit 1 has its devices J1-J4 reset to the zero-voltage state, circuit 1 is ready to accept inputs which will cause a reversal of current in interconnection line 2. To achieve this, pulsed current source 10 is now activated sending current Ib1 into transformer primary 7 via interconnection line 11. This induces a current Is2 in appropriately wound transformer secondary 5 which flows in device J2 in a direction opposite to current Ig2 which is already flowing in device J2 from gate current source 14. The oppositely directed currents which are substantially equal in magnitude effectively cancel each other so that zero current flows in device J2. At this point, current Ic1 is applied to control line 12 from a decoder (not shown) or other appropriate pulsed current source. The combination of current Ic1 in control line 12 and current Ig1 already flowing in device J1 from gate current source 14 switches device J1 to the voltage state momentarily diverting all of the current Ig1 into device J3 causing that device, in the presence of control current Ic1, to switch to the voltage state. The switching of devices J1, J3 opens all available circuit paths for current Ig1 with the exception of that path through device J2 which remains in the zero-voltage state undisturbed by the presence of the oppositely directed cancellation currents flowing therein.

Current Ig1 now flows through the parallel inductances represented by device J2 and transformer secondary winding 5, in series with the inductance of interconnection line 2 plus the impedance contribution of utilization circuit 3. The return path of current Ig1 is through resistor R1 to gate current source 14. Devices J1, J3 now reset to the zero-voltage state since the current through these devices dropped to zero upon switching. Devices J2, J4 did not switch so they remain in the zero-voltage state. Again, to reduce any circulating currents which may remain in interconnection line 2, a reset signal can be applied to control winding 15 which switches device J5 to its voltage state thereby eliminating circulating currents.

As indicated hereinabove, utilization circuit 3 may consist of one or more serially arranged memory cells which utilize at least a single circulating current therein to represent one of the two binary states. In operation, such memory cells often require the application of cell currents which have two different polarities. Circuit 1 will provide such currents at relatively higher speeds than prior art circuits and with fewer margin constraints.

Figure 2:
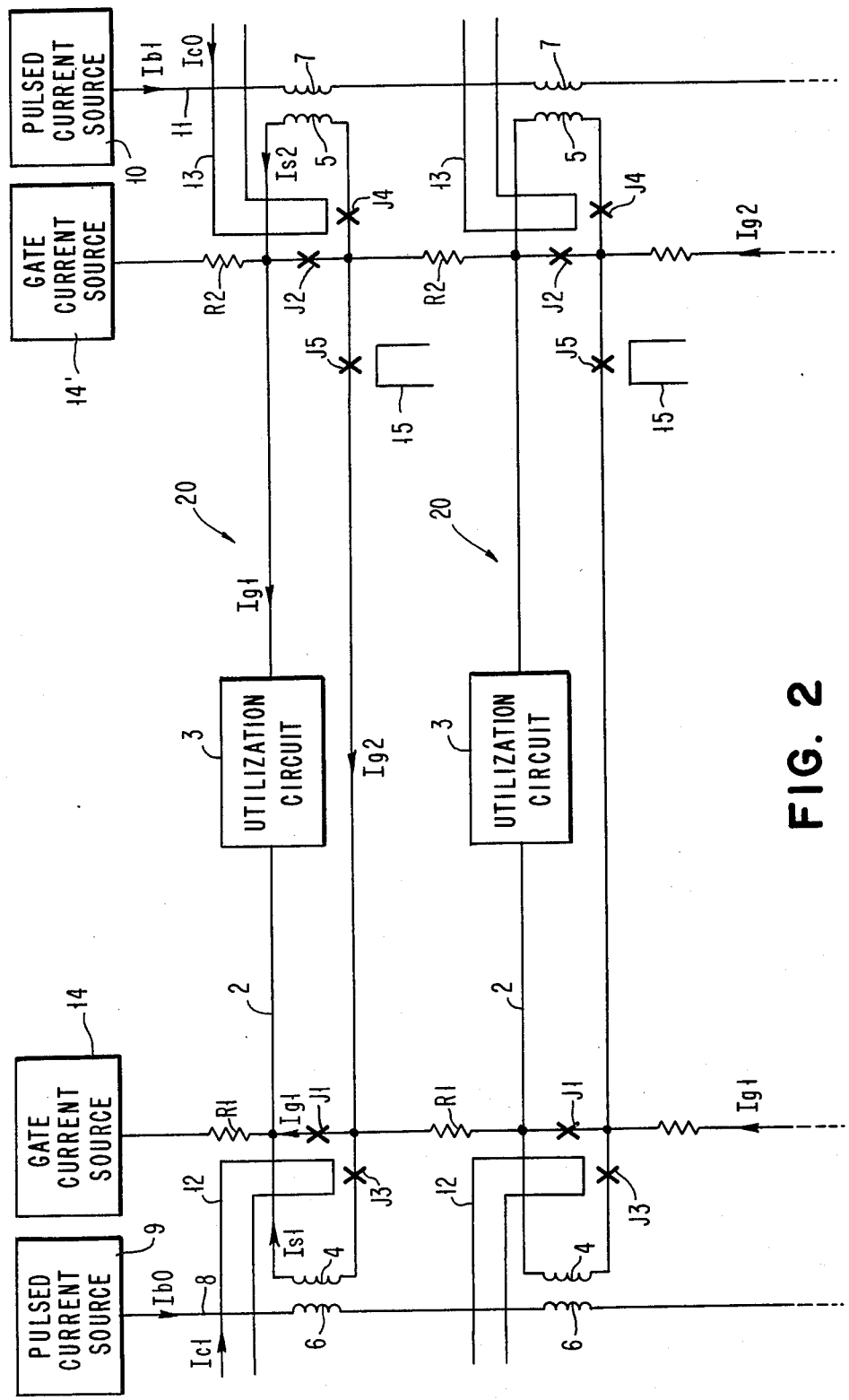
FIG. 2 is a schematic diagram of a double ended circuit which is electrically equivalent to the single ended circuit of FIG. 1. The circuit of FIG. 2 utilizes the same current cancellation and switching technique to provide one unit of current of changing polarity to a utilization circuit. Separate gate current sources can be utilized where topology requires that the switching and cancellation circuits be disposed some distance apart.

Referring now to FIG. 2, there is shown a schematic diagram of a plurality of current polarity switching circuits 20 which, like circuits 1 of FIG. 1, are capable of providing currents of opposite polarity to an interconnection line and to a utilization circuit which is disposed in series with the interconnection line. Apart from being a double-ended circuit as opposed to the single-ended circuit of FIG. 1, circuits 20 of FIG. 2 operate in a similar fashion to the circuits of FIG. 1. Because of this, similar elements in the circuit of FIG. 2 have been designated with the same reference characters as used in circuit 1 of FIG. 1.

Referring now to FIG. 2 in more detail, and to uppermost circuit 20 in particular, circuit 20 inludes two similar circuits disposed at opposite ends of interconnection line 2. The upper leftmost circuit includes Josephson devices J1, J3, transformer secondary and primary windings 4, 6, respectively, control line 12, pulsed current source 9 and gate current source 14 which are identical with the circuit of FIG. 1 containing the same reference numbered elements. Similarly, the upper rightmost circuit containing Josephson devices J2, J4, transformer secondary 5, transformer primary 7, control line 13, pulsed current source 10 and gate current source 14' is identical with that portion of circuit 1 of FIG. 1 containing devices J2, J4 and the other elements having the same reference characters.

From the foregoing, it can be seen that gate current source 14' is the only additional element and this obviously could be combined with source 14 to be a single gate current source. In the arrangement of FIG. 2, each of current sources 14, 14' provides current Ig to devices J1, J2, respectively.

In operation and assuming that all devices J1-J5 are in their zero-voltage state, currents Ig1 and Ig2 are applied, respectively, to devices J1, J2 from gate current sources 14, 14', respectively. Pulsed current source 9 is then actuated applying current Ib0 via interconnection line 8 to transformer primary 6 and to all other transformer primaries 6 disposed in series therewith. This action induces current Is1 in transformer secondary 4 which has a magnitude equal to gate current Ig1. By appropriately winding transformer secondary 4, for example, current Is1 has a polarity which is opposite to the polarity of current Ig1 in device J1. Since these currents are equal in magnitude and opposite in polarity, they cancel one another providing an effective gate current of zero in device J1. At this point, current Ic0 is applied to control line 13 from a decoder (not shown) or other appropriate pulsed current source which ultimately causes the switching of devices J2, J4 to the voltage state effectively blocking current paths through devices J2, J4 for current Ig2 of gate current source 14'. Current Ig2 has only one available path through reset device J5 which is in the zero-voltage state; through the parallel combination of inductances provided by device J1 which is in its zero-voltage state and secondary winding 4; the remainder of interconnection line 2 and utilization circuit 3 from whence it passes through gate current source 14' via resistor R2. Once this transfer of current is completed, devices J2, J4 reset to their zero-voltage state; device J5 is energized via control line 15 eliminating circulating currents and circuit 20 is reset and ready for another actuation. If now pulsed current source 10 is energized, current Is2 is set up in transformer secondary 5 which has a magnitude equal to and a polarity opposite to current Ig2. Current in device J2 is now effectively zero. At this point, current Ic1 is applied to control line 12 from a decoder (not shown) or other appropriate pulsed current source which switches devices J1, J3 to their voltage state causing current Ig1 to flow through reset device J5, the parallel combination of inductances due to device J2 and secondary winding 5, interconnection line 2 and utilization circuit 3. From thence, current Ig1 flows to gate current source 14 via resistor R1.

From the foregoing discussion, it should be clear that the most gate current any device in the zero-voltage state encounters is a current equal to Ig1 or Ig2 when any of circuits 1 or 20 is actuated. In this way, margin restrictions are relaxed from those of prior art circuits wherein the Josephson device carrying current at one time always encounters Ig, 2Ig or greater. Under these circumstances, such careful control of fabrication and current levels are required to insure that spurious switching of a device carrying this current does not occur due to disturb signals that a useful design is rendered virtually impossible. The Josephson devices of current switching circuits 1, 20 may be any well known type of Josephson junction or, in a preferred embodiment may be multiple junction devices known as Josephson junction interferometers. Interferometers of the type shown in U.S. Pat. No. 3,978,351, Ser. No. 592,000, filed June 30, 1975 and assigned to the same assignee as the present invention may be utilized in the practice of the present invention. In addition, all the interconnection circuitry like interconnection lines 2, 8 and 11 and control lines 12, 13 are made from materials which are superconductive at the temperature of liquid helium (approximately 4.2 degrees K). Typical Josephson junctions and interconnection circuitry which may be utilized in the practice of the present invention are shown in U.S. Pat. No. 3,758,795, Ser. No. 267,841, filed June 30, 1972 and assigned to the same assignee as the present invention. A typical fabrication technique for forming Josephson junction devices is shown in U.S. Pat. No. 3,849,276, Ser. No. 125,993, filed Mar. 19, 1971 which is also assigned to the same assignee as the present invention. Resistances such as R1, R2 which must not be superconductive at the circuit operating temperature may be fabricated with compatible materials which display resistance at the desired operating temperature. U.S. Pat. No. 3,913,120, Ser. No. 429,461, filed Dec. 28, 1973 and assigned to the same assignee as the present invention show a material and a method of fabrication of circuitry and a resistor which may be utilized in the practice of the present invention.

INDUSTRIAL APPLICABILITY

The circuits of FIG. 1 and FIG. 2 have application in the memory arrays of Josephson data processing digital computers. They are particularly applicable to Josephson memory arrays which require polarity reversals which set up clockwise and counterclockwise circulating currents in a memory cell which are representative of a binary 1 and a binary 0.

Having thus described my invention, what I now claim as new, and desire to secure by Letters Patent is:

1. A Josephson junction polarity reversing circuit comprising:

a pair of Josephson devices, means connected to each of said devices for applying a given value of gate current to each of said pair of devices, interconnection means connected to said pair of devices, and means connected to said pair of devices for applying opposite polarity currents of at most said given value of gate current to said interconnection means.

2. A Josephson junction polarity reversing circuit according to claim 1 further including utilization means disposed in series with said interconnection means.

3. A circuit according to claim 1 wherein said a pair of Josephson junction devices are multi junction interferometers.

4. A circuit according to claim 1 wherein said means for applying a given value of gate current is a source of direct current.

5. A circuit according to claim 1 wherein said means for applying a given value of gate current is a pulsed source of direct current.

6. A circuit according to claim 1 wherein said interconnection means is conductor of superconducting material.

7. A circuit according to claim 1 wherein said means connected to said pair of devices for applying opposite polarity currents includes means connected to said circuit for cancelling said given value of gate current in one of said pair of devices and, means connected to said circuit for diverting said given value of gate current from the other of a said pair of devices to said interconnection means via said one of said pair of devices.

8. A circuit according to claim 1 wherein said means connected to said pair of devices for applying opposite polarity currents includes a tranformer winding disposed in parallel with each of said pair of devices, a Josephson junction disposed in series in each said transformer winding, transformer means disposed in electromagnetically coupled relationship with each said a transformer winding for applying a cancellation current equal to said given value of gate current to one of said pair of devices and control means disposed in electromagnetically coupled relationship with one of said devices and one of said junctions and the other of said devices and the other of said junctions operable to switch the other of said pair of devices and the other of said junctions.

9. A circuit according to claim 2 wherein said utilization means is a superconductive memory cell which requires the application of bipolar currents to store binary information.

10. A circuit according to claim 12 wherein said utilization device is a logic circuit responsive to applied bipolar currents.

11. A circuit according to claim 1 further including means for eliminating circulating currents disposed in series in said interconnection means.

12. A circuit according to claim 7 wherein said means connected to said circuit for cancelling said given value of gate current in one of said pair of devices includes a transformer winding disposed in parallel with each of said pair of devices, and means disposed in electromagnetically coupled relationship with each said a transformer winding for applying a current to said one of said pair of devices of equal magnitude but of opposite polarity to said given value of current.

13. A circuit according to claim 7 wherein said means for diverting said given value of gate current from the other of said pair of devices includes a Josephson junction device disposed in series in each said transformer winding, and control means disposed in electromagnetically coupled relationship with said pair of devices operable to switch the other of said pair of devices.

14. A circuit according to claim 7 wherein said means for diverting said given value of gate current from the other of said pair of devices includes a Josephson junction device disposed in series in each said transformer winding, and control means disposed in electromagnetically coupled relationship with said pair of devices operable to switch the other of said pair of devices and an associated Josephson junction.

15. A circuit according to claim 8 further including a separately actuable current source connected in series with each said transformer means.

16. A circuit according to claim 12 further including control means disposed in electromagnetically coupled relationship with one of said devices and one of said junctions and the other of said devices and the other of said junctions operable to switch the other of said pair of devices and the other of said junctions.

17. A circuit according to claim 12 wherein said means for applying a current of equal magnitude but of opposite polarity to said given value of current includes another transformer winding electromagnetically coupled relationship with each said a transformer winding and a separately actuable current source connected in series with each said another transformer winding.

18. A circuit according to claim 17 further including control means disposed in electromagnetically coupled relationship with one of said devices and one of said junctions and the other of said devices and the other of said junctions operable to switch the other of said pair of devices and the other of said junctions.

* * * * *